United States Patent

[11] 3,560,721

[72] Inventor Eldon D. Vaughn
Berkeley, Calif.
[21] Appl. No. 605,675
[22] Filed Dec. 29, 1966
[45] Patented Feb. 2, 1971
[73] Assignee American Optical Corporation
Southbridge, Mass.
a corporation of Delaware. by mesne assignments

[54] REVERSIBLE COUNTER
8 Claims, 5 Drawing Figs.

[52] U.S. Cl. .......... 235/92
[51] Int. Cl. .......... G06m 3/14
[50] Field of Search .......... 340/347; 235/92; 307/222; 328/44, 45; 315/84.5

[56] References Cited
UNITED STATES PATENTS

| | | | |
|---|---|---|---|
| 2,647,997 | 8/1953 | Williams | 235/92 |
| 3,335,266 | 8/1967 | Somlyody | 235/92 |
| 3,355,595 | 11/1967 | Penver | 235/92 |
| 3,370,158 | 2/1968 | Lehmer | 235/92 |
| 3,371,222 | 2/1968 | Guettler et al. | 307/222 |
| 3,437,832 | 4/1969 | Kopetski | 307/222 |

*Primary Examiner*—Maynard R. Wilbur
*Assistant Examiner*—Charles D. Miller
*Attorney*—Gregg and Hendricson

ABSTRACT: A plurality of $2n+1$ counting devices with each having forward and backward pulse inputs and interconnected so that $n$ devices conduct while $n+1$ are nonconducting. The output of one of the counting devices is connected to the input of each of two additional counting devices of a binary stage and through a gate controlled by one of the binary stage devices as a count output.

FIG-1-A

INVENTOR.
ELDON D. VAUGHN

BY Cregg & Stidham
ATTORNEYS

FIG-1-B

INVENTOR.
ELDON D. VAUGHN

BY Gregg & Stidham
ATTORNEYS

PATENTED FEB 2 1971 3,560,721

INVENTOR.
ELDON D. VAUGHN

BY Gregg & Stidham
ATTORNEYS

INVENTOR.
ELDON D. VAUGHN
BY Gregg & Stidham
ATTORNEY

REVERSIBLE COUNTER

This invention relates to a counting circuit and more particularly to a counting circuit which includes a ring of switching stages in which a pair of adjacent stages in the nonconducting condition places another stage in a conducting state.

The circuit of this invention is well adapted for use in a quinary-binary type counter as shown in the drawings and described in detail hereinbelow. Quinary-binary counters are well known and often include a quinary ring of five counting stages in which one stage is in one state or condition and the remainder are in the opposite state. Where bistable trigger circuits, such as bistable flip-flops, are included in the trigger stages one of the two active elements conducts while the other is cut off, and relatively large amounts of power are consumed at all times. The number of active elements may be reduced by employing a single controllable element in each stage of the counter. However, with most prior art counters one stage in the nonconducting condition drives the remainder of the stages to a conducting condition whereby a relatively large amount of power is drawn under all conditions.

An object of this invention is the provision of a counting ring comprising interconnected stages of controllable elements in which fewer elements are conducting than are cut off.

An object of this invention is the provision of a counting ring comprising a plurality of stages having a single semiconductor in each stage, the majority of which semiconductors are in the off condition and the minority of which are in the on condition.

An object of this invention is the provision of a counter comprising a ring of $2n+1$ switching elements of which $n$ elements are conducting while $n+1$ elements are nonconducting.

An object of this invention is the provision of an improved quinary-binary counter which requires a minimum of active circuit elements.

These and other objects and advantages are achieved by a ring of counting stages each of which comprises a semiconductor having a conductive and nonconductive state of operation. The output electrodes of pairs of adjacent semiconductors in the ring are connected to the input electrodes of other semiconductors such that two adjacent semiconductors in the nonconducting state switches another semiconductor to a conducting state. With a ring of $2n+1$ stages, $n+1$ stages in the nonconducting state function to place $n$ stages in a state of conduction. For use in a quinary-binary counter a ring of five stages is employed to drive a binary unit comprising a bistable multivibrator. A novel arrangement of gates and gate control means are employed for coupling the quinary ring to the multivibrator and to the input of the following counter unit.

In the drawings, wherein like reference characters refer to the same parts in the several views:

FIGS. 1A and 1B, when taken together, show a schematic circuit diagram of a novel quinary-binary type counter embodying this invention;

Figure 4:
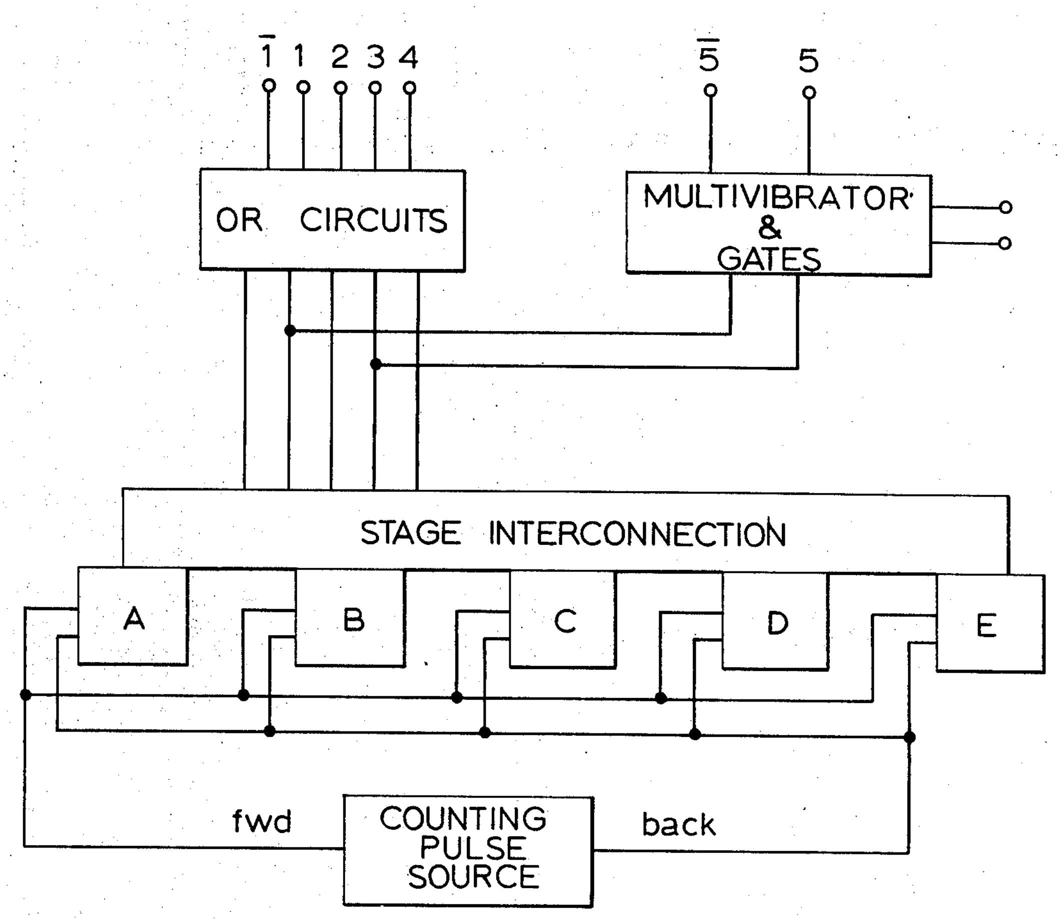
FIG. 4 is a diagrammatic illustration of the invention.

Referring first to FIG. 4, there is shown a plurality of counting stages A, B, C, D and E with a counting pulse source connected to each stage for applying either forward or backward counting pulses thereto. The counting stages are interconnected so that of $2n+1$ stages, $n+1$ stages are nonconducting and $n$ stages are conducting as described in detail below. The outputs of the counting stages are applied to a combination of OR circuits to thus energize output terminals $\overline{1}$, 1, 2, 3, 4 as indicated. Additionally the output of two counting stages are applied to operate a multivibrator and gating circuits for producing an output at either a $\overline{5}$ or 5 output terminal. The counters may be cascaded and to this end count signals are applied to output terminals for occurrence of forward or backward counts of 10 in the illustrated embodiment.

Figure 1:
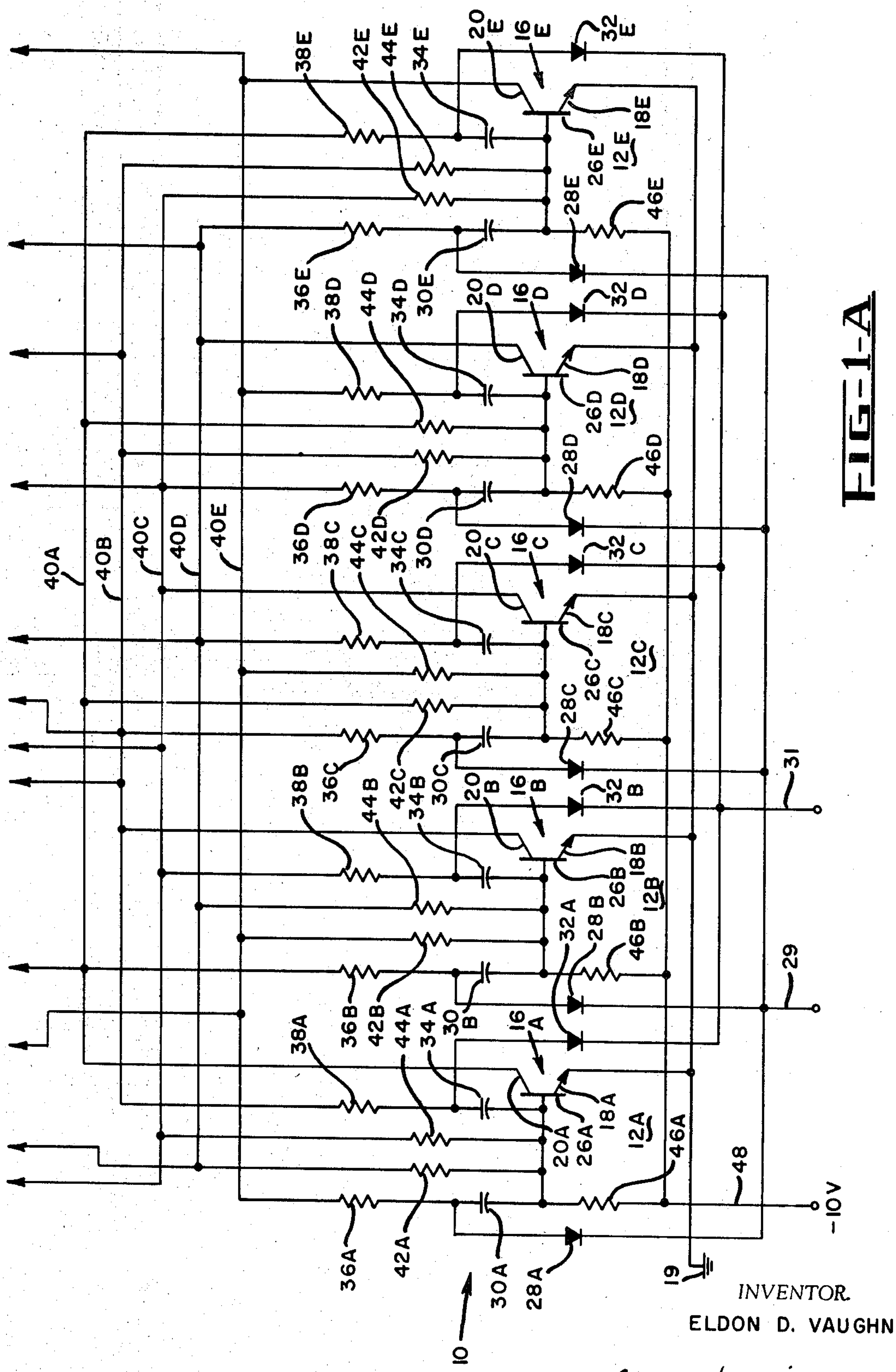

Reference is now made to FIGS. 1A and 1B wherein there is shown a quinary-binary counter embodying this invention, which comprises a quinary ring 10 of five switching stages designated 12A, 12B, 12C, 12D and 12E and a binary stage 14 comprising a bistable multivibrator. The quinary stages 12A—12E are of identical design, and corresponding elements of the stages have the same reference numeral but are supplied with different subscripts A, B, C, D and E to identify elements in a particular stage where required.

The quinary stages comprise a single transistor 16A—16E which is switched between fully conducting or "on," and nonconducting or "off" conditions. The transistor emitter electrodes 18A—18E are directly connected to a common ground terminal 19, and the collector electrodes 20A—20E are connected to a positive potential bus 22 through load resistors 24A—24E. The bus 22 is maintained at + 15 volts by a source of supply, not shown.

The counting ring is driven in a forward direction by abruptly changing negative-going forward counting pulses connected to a forward counting bus 29, which bus is connected to the base electrodes 26A—26E of the transistors in each stage of the quinary ring through gating circuits comprising diodes 28A—28E and coupling capacitors 30A—30E, respectively. As will become apparent hereinbelow, the forward counting bus 29 is normally maintained at a positive potential (of approximately +10 volts, for example) whereby forward counting pulses are produced by simply abruptly switching the bus 29 to ground potential by any suitable switching means, not shown. A single forward counting pulse is produced each time the bus 29 is abruptly grounded. A similar arrangement for driving the counter in the reverse direction is provided by the inclusion of a reverse counting bus 31 which is connected to the base electrodes 26A—26E of each stage of the quinary unit through gating circuits comprising diodes 32A—32E and coupling capacitors 34A—34E, respectively. The reverse counting bus also is normally maintained at approximately +10 volts, and reverse counting pulses are supplied to the bus 31 by simply abruptly connecting the bus to ground potential.

The gate control circuits for gating the forward counting pulses to the switching stages also include resistors 36A—36E to which resistors gate control signals are supplied. It will be seen that the resistors 36A—36E, each have one end connected to the junction between the diodes 28A—28E and capacitors 30A—30E, respectively. The opposite end of each of the resistors 36A—36E is connected to a selected one of buses 40A—40E. The buses 40A—40E, which are directly connected to the collector electrodes 20A—20E of the switching transistors 16A—16E, have a positive potential of about 10 volts applied thereto when the associated switching stage is cut off, and are at substantially ground potential when the associated switching stage is conducting through the low impedance path of the current saturated transistors.

The potential on the buses 40A—40E is applied through the resistors 36A—36E to the anodes of the diodes 28A—28E as gate control signals. The operation of the gate will be described in detail hereinbelow. For present purposes it will be sufficient to understand that with a positive gate control applied to the capacitor, the capacitor is discharged upon receipt of a negative going forward counting pulse and if the stage is conducting it will be switched off by the discharge current. On the other hand, with a zero potential gate control signal at a capacitor, the application of a forward counting pulse thereto cannot discharge the capacitor since it has no charge, and thus cannot serve to switch the stage to the off condition. Obviously, those stages already in an off condition will not change condition with the application of a forward count pulse thereto.

Identical gating networks comprising diodes 32A—32E, capacitors 34A—34E and resistors 38A—38E are included in each stage for gating of reverse counting pulses thereof. The forward and reverse pulse gating networks differ only in that the resistors 38A—38E in the reverse pulse gating networks are connected to different buses 40A—40E than the associated resistors 36A—36E in the forward pulse gating networks, and the counting pulses are obtained from different buses 29 and 31. It will here by noted that the forward pulse gate control resistors 36A, 36B, 36C, 36D and 36E are connected to the collector buses 40E, 40A, 40B, 40C and 40D, respectively, whereas the negative gate control resistors 38A, 38B, 38C, 38D and 38E are connected to the collector buses 40B, 40C, 40D, 40E and 40A, respectively.

In addition to the forward and reverse pulse gate network, each stage is provided with a DC gate for qui-stability of the counting ring 10. It will be seen that the base electrodes 16A—16E of the transistors are connected through first and second resistors 42A—42E and 44A—44E to selected collector buses 40A—40E, and through third resistors 46A—46E to a negative supply bus 48 connected to a negative 10-volt supply source, not shown. It will be noted that the first DC gating resistors 42A, 42B, 42C, 42D and 42E are connected to the collector buses 40D, 40E, 40A, 40B and 40C, respectively, whereas the second DC gating resistors 44A, 44B, 44C, 44D and 44E are connected to the collector buses 40C, 40D, 40E, 40A and 40B, respectively.

Under quiescent operating condition (with no forward or reverse counting pulses applied to the ring) if the collector buses to which the first and second DC gating resistors of a stage are connected are both at ground potential the base electrode of the transistors in that stage is at about −6.6 volts, and if one bus is at ground potential and the other is at +10 volts, a base electrode of approximately zero volts is obtained. In either case the stage is held in a nonconducting condition. On the other hand, when the two collector buses to which the first and second DC gating resistors are connected are both at about +10 volts, the stage is switched to a conducting condition. With this DC gating arrangement, one stage is turned on when the associated first and second gating resistors are connected to stages which are switched off. Consequently with a total of $2n+1$ stages, $n$ stages are switched to a conducting condition by $n+1$ stages in the nonconducting state.

The operation of the quinary section will now be explained and for purposes of explanation, assume that stages 12A, 12B and 12E are nonconducting and that stages 12C and 12D are conducting. Under these conditions it will be seen that buses 40A, 40B and 40E are at about +10 volts, and buses 40C and 40D are at about ground potential. With the illustrated connection of these buses to the DC gating circuits the base electrodes 26A—26E are at approximately −6.6, 0, +0.7, +0.7 and 0 volts, respectively. Thus, it is seen that the two stages 12A and 12E in the off condition turn on stage 12C and that the two stages 12A and 12B in the off condition turn on stage 12D.

Assume now the application of a negative going forward counting pulse on the forward counting line 29. Since stages 12A, 12B and 12E are in the nonconducting condition a negative signal applied to the base electrodes of the transistors in these stages will have no affect on the state of these stages. Of the two conducting stages 12C and 12D, it will be noted that the resistors 36C and 36D in the AC gating circuits are connected to the collector buses 40B and 40C for application of about +10 and zero volts thereto, respectively. Consequently, diode 28D is reversed biased prior to the forward counting pulse and is zero biased during the forward counting pulse. As a result, the voltage at the capacitor 30D is unchanged upon application of a forward counting pulse at line 29 whereby stage 12D remains in the conducting state.

On the other hand, because of the positive gate control signal applied thereto, diode 28C is forward biased upon application of the negative-going forward counting pulse thereto whereupon the potential at the junction between the resistor 36C and capacitor 30C rapidly changes from approximately +10 volts to zero potential. The RC time constant of the capacitor 30C and resistors 42C and 44C is large in comparison with transition of the counting pulse. The potential (of about 6 volts) across the capacitor is incapable of changing appreciably during the sudden transition whereupon the base electrode 26C of the transistor 16C is driven negative to cut off this stage. When this stage 12C is cut off the collector bus 40C rises to approximately +10 volts for application of +10 volts on the resistor 42E of the DC gating network for stage 12E. Since the other resistor 44E of this AND gate network also is connected to a +10-volt bus 40B, stage 12E is turned on. Now stages 12D and 12E are conducting and stages 12A, 12B and 12C are cut off. Similarly with the application of the next forward counting pulse, stages 12B, 12C and 12D are cut off and stages 12A and 12E conduct. Table I hereinbelow shows the stage of conduction of the various transistors of the counter including the transistors in the quinary unit from which the switching sequence may be readily ascertained. From the table it will be apparent that the quinary ring 10 has five stable states, with two stages conducting and three cut off during each state.

TABLE I

| | Transistor | | | | | | | | | | | | | |
|---|---|---|---|---|---|---|---|---|---|---|---|---|---|---|
| | 16A | 16B | 16C | 16D | 16E | 50A | 50B | 50C | 50D | 50E | 62–1 | 62–2 | 96–1 | 96–2 |
| Count: | | | | | | | | | | | | | | |
| 0 | Off | Off | On | On | Off | Off | On | On | On | On | On | Off | Off | On. |
| 1 | Off | Off | Off | On | On | On | Off | On | On | On | On | Off | Off | On. |
| 2 | On | Off | Off | Off | On | On | On | Off | On | On | On | Off | Off | On. |
| 3 | On | On | Off | Off | Off | On | On | On | Off | On | On | Off | Off | On. |
| 4 | Off | On | On | Off | Off | On | On | On | On | Off | On | Off | Off | On. |
| 5 | Off | Off | On | On | Off | Off | On | On | On | On | Off | On | On | Off. |
| 6 | Off | Off | Off | On | On | On | Off | On | On | On | Off | On | On | Off. |
| 7 | On | Off | Off | Off | On | On | On | Off | On | On | Off | On | On | Off. |
| 8 | On | On | Off | Off | Off | On | On | On | Off | On | Off | On | On | Off. |
| 9 | Off | On | On | Off | Off | On | On | On | On | Off | Off | On | On | Off. |

As mentioned above, for reverse counting, negative-going counting pulses are supplied to bus 31 for application to the diodes 32A—32E. Again assuming the condition wherein the stages 12A, 12B and 12E are nonconducting and stages 12C and 12D are conducting, the negative-going reverse counting pulse forward biases diode 32D whereupon a 10-volt decrease is effected at the junction between the capacitor 34D and resistor 38D and, because of the steepness of the leading edge of the pulse, and the relatively longer RC time constant of the capacitor 34D and resistors 42D and 44D, a 10-volt decrease is effected at the base electrode 26D of the transistor 16D to cut off this stage. With this stage cut off a positive potential is developed at bus 40D which is applied to the DC gating resistor 44B. Since the other AND circuit resistor 42B is also at a positive potential, a positive DC signal is provided at the base electrode of the transistor 16B to turn on this stage. Consequently, stages 16B and 16C are now conducting and stages 16A, 16D and 16E are cut off, and from the chart shown in Table I it will be seen that the quinary section is stepped in a reverse direction. Also, the positive potential at bus 40D conditions the AC gate comprising resistor 38C, capacitor 34C and diode 32C for conduction upon receipt of the next reverse counting pulse to turn off stage 12C. Therefore, additional reverse counting pulses at the bus 29 will continue to reverse counting operation in a manner similar to the forward counting operation described above.

Decoding of the states of the quinary stages 12A—12E is achieved by OR gate circuits having inputs connected to the buses 40A—40E and outputs connected to transistors 50A—50E. The emitter electrodes 52A—52E of transistors 50A—50E are directly connected to the ground terminal 19, whereas, the collector electrodes 54A—54E are connected through individual load resistors 56A—56E to the positive 15-volt supply. The base electrodes are connected through first and second resistors 58A—58E and 60A—60E to selected collector buses 40A through 40E. In particular, the resistors 58A and 60A are connected to buses 40C and 40D, respectively, the resistors 58B and 60B to buses 40D and 40E, respectively, the resistors 58C and 60C to buses 40E and 40A, respectively, the resistors 58D and 60D to buses 40A and 40B, and the resistors 58E and 60E to buses 40B and 40C, respectively. When one bus or both buses of any of the above recited pairs of buses are at a positive potential the associated OR circuit transistor conducts. Only when both of the buses of a pair of buses is at zero potential is the associated OR circuit transistor cutoff. In the state of the quinary ring wherein it was assumed that stages 12A, 12B and 12E are cut off and that stages 12C and 12D are conducting, transistor 50A is cut off and transistors 50B, 50C, 50D and 50E are conducting. When the quinary unit steps forward one count wherein stages 12D and 12E conduct, the transistor 50B is cut off. Similarly, during the counting cycle, the conduction of quinary stages 12E and 12A cut off transistor 50C; the conduction of quinary stages 12A and 12B cut off transistor 50D; and the conduction of quinary stages 12B and 12C cut off transistor 50E. The outputs from the transistors 50A through 50E serve to indicate the quinary counter states of $\bar{1}$, 1, 2, 3 and 4, respectively, and may be connected to any utilization device, not shown.

The outputs from the two transistors 50A and 50E are also used as gate control signals for control of pulses to the binary unit bistable multivibrator 14. It will here be noted that each transistor 50A and 50E is provided with a relatively large capacitor 61A and 61E connected between the base and collector electrodes thereof to increase the rise and fall, or decay time of the pulse output at the collector electrodes. Sloping pulse edges are required for use of these pulses as gate control signals as will become apparent from the description below.

As seen in FIG. 1B the bistable multivibrator 14 comprises a pair of transistors 62-1 and 62-2, one of which is conducting when the other is cutoff. The transistors 62-1 and 62-2 each have their emitter electrodes connected to ground, and their collector electrodes individually connected through load resistors 64-1 and 64-2 to the positive 15-volt line 22. The base electrode 66-1 is connected through a first resistor 68-1 to the negative 10-volt supply, and through a second transistor 70-1 to the collector electrode of the second transistor 66-2. Similarly, the base electrode 66-2 of the second transistor 62-2 is connected through a first resistor 68-2 to the negative 10-volt supply, and through a second resistor 70-2 to the collector electrode of the first transistor. One of the transistors 62-1 and 62-2 is turned on when the other is cut off by means of the interconnections of the collector and base electrodes through the resistors 70-1 and 70-2.

The bistable multivibrator 14 is driven by negative going pulses from the quinary ring through AC gating circuits of a type similar to those utilized at the individual stages of the quinary ring. For counting in the forward direction the bistable multivibrator is driven by negative-going pulses obtained from collector bus 40D of the quinary unit and connected to the transistors 62-1 and 62-2 through a first gating diode 72. A bus 73 from the diode 72 is connected to the base electrodes 66-1 and 66-2 of the bistable multivibrator transistors through second gating diodes 74-1 and 74-2 and coupling capacitors 76-1 and 76-2, respectively. Similarly, reverse counting pulses for driving the bistable multivibrator during reverse counting are obtained from the collector bus 40B of the quinary unit which is connected through a first gating diode 78 to a bus 79. From the bus 79 the reverse counting pulses are adapted for connection to the base electrodes 66-1 and 66-2 of the bistable multivibrator transistors through second gating diodes 80-1 and 80-2 and coupling capacitors 82-1 and 82-3, respectively.

Gating of forward counting pulses through the diode 72 is under control of a gate control circuit which includes a diode 84 having its anode connected to the anode of the diode 72 and its cathode connected through lead wire 86 to the collector electrode of transistor 50E. The diode 72 is forward and reverse biased at the appropriate times in the counting cycle to pass negative-going forward counting pulses from the bus 40D during forward drive of the counter but not during reverse drive. A similar arrangement for gating of reverse counting pulses through diode 78 from the collector bus 40B is provided by use of a diode 90 having its anode connected to the anode of the diode 78 and its cathode connected through lead wire 91 to the collector electrode of transistor 50A. The diode 78 is forward and reverse biased at the appropriate times in the counting cycle to pass negative-going reverse counting pulses from the bus 40B during reverse drive of the counter but not during forward drive. Gating of forward and reverse counting pulses through the diodes 72 and 78, respectively, will be described in greater detail hereinbelow. First, the gating of forward and reverse counting from the buses 73 and 79 to the multivibrator will be described.

Gating of forward counting pulses at the bus 73 to the transistors 62-1 and 62-2 is under control of gate control signals applied to the diodes 74-1 and 74-2 through resistors 92-1 and 92-2. one end of the resistor 92-1 is connected to the junction between the diode 74-1 and capacitor 76-1, and the other end is connected to the collector electrode of the transistor 62-2. Similarly, one end of the resistor 92-2 is connected to the junction between the diode 74-2 and capacitor 76-2, and the other end is connected to the collector electrode of the transistor 62-1. When transistor 62-1 is conducting and transistor 62-2 is cut off, the substantially zero collector potential from transistor 62-1 is applied through the resistor 92-2 to the junction between the diode 74-2 and capacitor 76-2. Upon occurrence of a negative-going forward counting pulse at the bus 73 the diode 74-2 switches from a reverse-biased condition to substantially zero bias condition. Consequently, no change in potential is effected at the junction between the diode 74-2 and capacitor 76-2 upon occurrence of a forward counting pulse, and the signal is not applied to the base electrode 66-2.

Under the above assumed conditions wherein transistor 62-1 is conducting and transistor 62-2 is cut off, a positive gate control signal of approximately 10 volts from the collector electrode of the transistor 62-2 is applied through the resistor 92-1 to the junction between the diode 74-1 and capacitor 76-1. Consequently, upon occurrence of the negative-going forward counting pulse at the bus 73 the diode 74-1 is forward biased and the potential at the junction between the diode 74-1 and capacitor 76-1 abruptly changes from +10volts to substantially zero volts. The charge on the capacitor 76-1 is unable to change appreciably during the sudden transition since the RC time constant of the capacitor 76-1 and resistor 92-1 is large in relation to the transition period. Consequently, a 10-volt decrease in potential is effected at the base electrode of transistor 62-1 to switch the same from conducting to a nonconducting condition. Through the interconnection of the collector electrode of the transistor 62-1 to the base electrode of transistor 62-2, transistor 62-2 is switched to the conducting state when transistor 62-1 switches to the nonconducting condition. In this condition of the binary unit a positive gate control signal is applied from the collector electrode of transistor 62-1 through the resistor 92-2 to the junction between the diode 74-2 and capacitor 76-2 to gate the diode open, and a substantially zero gate control signal is applied from the collector electrode of transistor 62-2 through the resistor 92-1 to the junction between the diode 77-1 and capacitor 74-1 to close the diode gate. It is seen, therefore, that when the transistors 62-1 and 62-2 reverse conducting states, the date control signals to the resistors 92-1 and 92-2 also switch states.

A similar gate control circuit for the diodes 80-1 and 80-2 in the reverse counting circuit is provided by means of resistors 94-1 and 94-2. Gate control signals for the resistors 94-1 and 94-2 are provided by connection of the resistors to the collector electrodes of the transistors 62-2 and 62-1, respectively. The gate associated with the conducting transistor of the bistable flip-flop 14 is opened to permit conduction of the negative going reverse counting pulse thereto, whereas the gate associated with nonconducting transistor is closed to prevent the reverse counting pulse from reaching the base electrode of the nonconducting transistor. As mentioned above, these gates for gating forward and reverse counting pulses to the transistors 62-1 and 62-2 from the buses 73 and 79 are of the same type included in the gating of counting pulses to the stages 12A-—12E from the forward and reverse pulse input buses 29 and 31, and require no further description.

Outputs from the collector electrodes of the transistors 62-1 and 62-2 of the bistable multivibrator 14 are connected to the base electrodes of transistors 96-1 and 96-2 through resistors 98-1 and 98-2, respectively. The emitter electrodes of the transistors 96-1 and 96-2 are connected to ground potential, and the collector electrodes are connected to a +15-volt bias supply potential through individual resistors 100-1 and 100-2. It will be apparent that when bistable multivibrator transistor 62-1 conducts, transistor 96-1 is cut off, and when transistor 62-2 is cut off transistor 96-1 conducts. Similarly, when transistor 62-2 conducts, transistor 96-2 is cut off and when transistor 62-2 is cut off, transistor 96-2 conducts. The outputs from the collector electrodes of the transistors 96-1 and 96-2 comprise negative-going pulses from approximately +10 volts to approximately zero volts. An output pulse from transistor 96-1 at terminal 102-1 indicates 5 whereas an output pulse from transistor 96-2 at terminal 102-2 indicates 5 from the binary unit. These outputs, together with the outputs from transistors 50A—50E indicate the state of the counter.

When a decade counter unit of the type shown in FIGS. 1A and 1B and described above is cascaded with one or more other reversible decade counter units (which also may be of the same type as that shown) outputs are required for driving the following decade counter unit. With the novel counter of this invention a negative-going forward counting pulse is provided at an output terminal 104-2 when going from the 9 state to the zero state when counting forward, and a negative-going reverse counting pulse is provided at an output terminal 104-1 when going from the O state to the 9 state when counting in a reverse direction. As seen in FIG. 1B, the forward and reverse binary drive buses 73 and 79 are connected to the output terminals 104-2 and 104-1 through gating diodes 106-2 and 106-1, respectively. A fragmentary portion of a second counter unit designated 10' is shown connected to the output terminals 104-1 and 104-2 which counter unit is of the same type as the unit 10. Only a fragmentary portion of one quinary counter stage 12' is shown in the unit designated 10'. The same reference numerals are applied to the components of the stage 12' as are employed in the stages 12A—12E, described above, but the letter prefixes have been changed to a prime.

Gate control signals for forward and back-biasing the diodes 106-1 and 106-2 are obtained from the collector electrodes of the transistors 96-1 and 96-2 through diodes 108-1 and 108-2, respectively. Relatively large capacitors 110-1 and 110-2 are connected between the base and collector electrodes of the transistors 96-1 and 96-2 respectively, to provide the control signal outputs therefrom with sloping leading and trailing edges. It will be seen that when the transistor 96-2 is conducting a near zero potential signal is applied to the cathode of the diode 108-2. Consequently, the junction between diodes 108-2 and 106-2 is thereby back-biased or zero biased during this time to prevent forward going counting pulses at the bus 73 from passing therethrough. As noted above, transistor 96-2 is conducting during the 0 to 4 counter unit states whereby diode 106-2 is gated closed when the counter adds a count when going from state 4 to state 5.

When transistor 96-2 is cut off, a positive potential signal is applied to the cathode of the diode 108-2. Now, (if a positive 10-volt gate control signal is present at the resistor 36') the application of a negative-going forward counting pulse to the bus 73 (when going from state 9 to state 0) forward biases the diodes 106-2 and 28'. The potential at the junction between the diode 28' and capacitor 30' abruptly drops from approximately +10 volts to zero potential. As with the stages 12A-—12B, the charge on the capacitor 30' is unable to change appreciably during the sudden transition whereupon the 10-volt decrease is produced at the base electrode of transistor 16' to switch it to nonconducting condition.

A similar gating circuit is provided for gating the diode 106-1 in the reverse counting circuit opened and closed. In this circuit the gate control signal is obtained from the collector electrode of the transistor 96-1. As described above and as seen from table I, the transistor 96-1 conducts during the counter unit states of 9 to 5 for closure of the gate during this period, and is cut off during states 4 to 0 to open the gate. Thus, a reverse counting pulse at the bus 79 will forward bias the diodes 106-1 and 32' to provide a conducting path therethrough to the capacitor 34' when going from state 0 to state 9 of the counter. Conversely, a reverse counting pulse at the bus 79 is blocked by the back-biased diode 106-1 when going from state 5 to state 4. Therefore, it will be understood that only reverse counting pulses which occur when counting from state 0 to state 9 to find a conducting path from the bus 79 through diodes 106-1 and 32' to the capacitor 34' in the next counter unit 10'.

A brief description of the operation of the counter will now be given. Assume that the counter is at count 0 whereby the transistors are in the conducting states illustrated at count 0 of table I. The 0 count is indicated by 1 and 5 (not 1 and not 5, respectively) states of the quinary and binary sections 10 and 14 as provided by the off condition of transistors 50A and 96-1, respectively.

Assume that the bus 29 is abruptly grounded for application of a forward counting pulse to the quinary section. When bus 29 is grounded, the diode 28C is forward biased whereupon the voltage at the junction between the capacitor 30C and resistor 36C suddenly drops from about +10 volts to 0 volts. The charge on the capacitor 30C is unable to change appreciably during the sudden transition because the RC time constant of the capacitor and resistors 42C and 44C is large in comparison with the transition period. Consequently, a 10-volt decrease is effected at the base electrode of transistor 16C to switch it off.

With transistor 16C cut off, the collector electrode potential rises to about +10 volts, which +10-volt signal is coupled through the bus 40C to the DC gate resistor 42E. The other gate resistor 44E already has a +10-volt signal applied thereby by connection thereof through bus 40B to the collector electrode of transistor 16B, whereupon transistor 16E is switched on. Now transistors 16A, 16B, and 16C are in the off condition and transistors 16D and 16E are switched on.

With bus 40C now at +10 volts, transistor 50A is turned on, and with both buses 40D and 40E at zero potential, transistor 50B is turned off. The count of 1 is indicated by the 1 and 5 states of the quinary and binary sections, respectively, as provided by the off condition of transistors 50B and 96-1.

Figure 2:
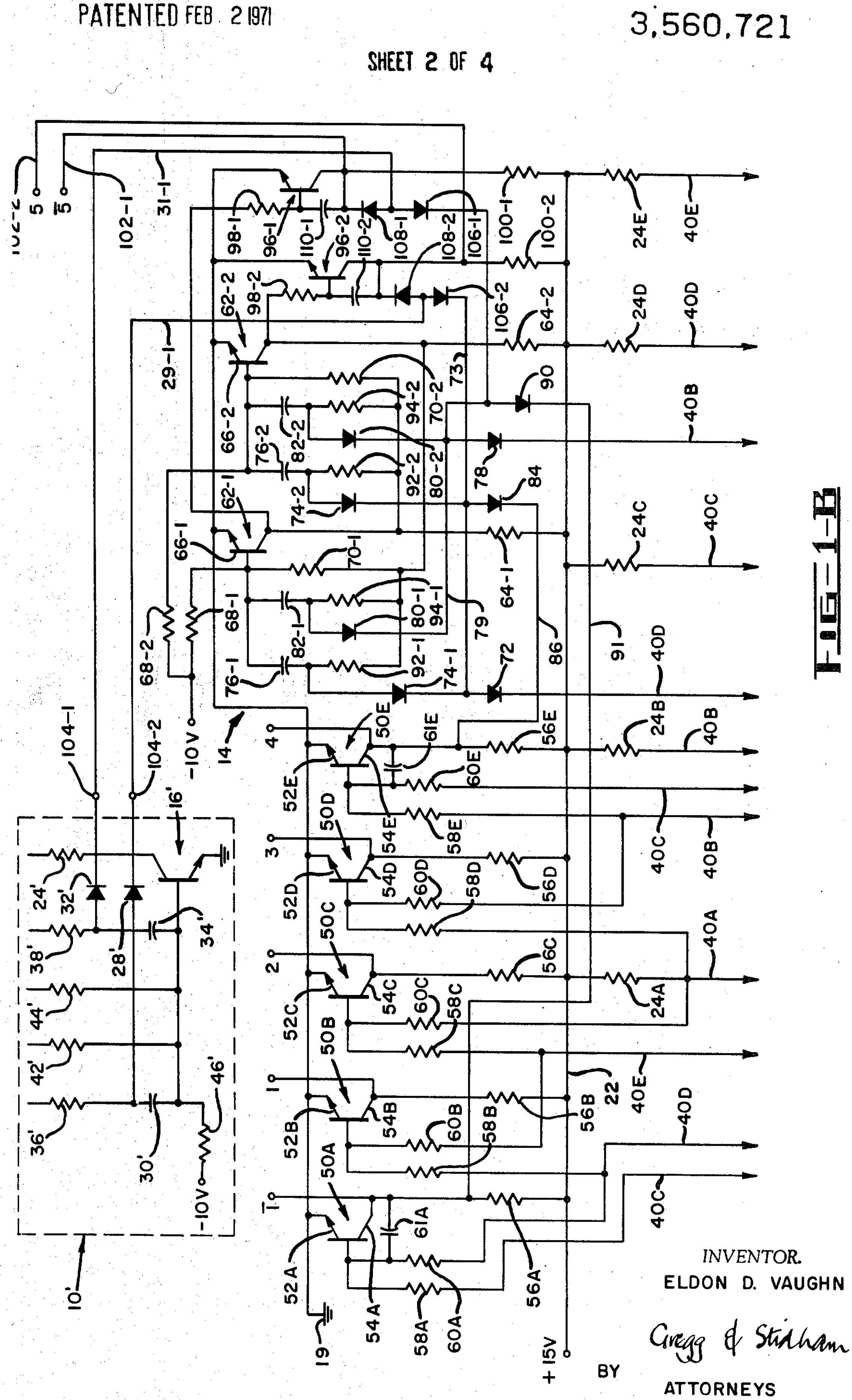
FIG. 2 shows a series of waveforms which occur during the forward counting operation.

When transistor 50A switches from the off to the conducting state the collector electrode potential slowly decreases from approximately +10 to 0 volts, as seen at waveform 5 of FIG. 2. The negative-going gating signal is connected through lead wire 91 to the diode 90. The diodes 90 and 80-1 are thereby forward biased whereupon the voltage at the junction between capacitor 82-1 and resistor 94-1 slowly reduces to zero from approximately the +10-volt level. The RC time constant of the capacitor 82-1 and resistor 68-1 is small in comparison with the transition period of the gating signal. Consequently, the charge on the capacitor 82-1 changes with the gate control signal and the voltage at the base electrode of the transistor 62-1 is substantially unaffected by the gate control signal. With the bus 79 at the zero potential the diode 78 is reverse biased to prevent application of counting pulses to the bistable multivibrator from bus 40B. It will be understood that the waveform 5 of FIG. 2 depicts the potential at the bus 79 when counting forward. An examination of the waveform reveals that the bus 79 is at ground potential during counter states 1 to 4 and 6 to 9. During forward counting the negative-going reverse counting signals at bus 40B (waveform 4 of FIG. 2) when going from state 2 to state 3, and when going from state 7 to state 8 are blocked from reaching the bistable multivibrator by the reverse biased diode 78. (However, during reverse counting the negative going signals at the bus 40B (waveform 4 of FIG. 3) when going from state 0 to state 9, and when going from state 5 to state 4, forward bias the diode 78 and are conducted to the multivibrator to change the state of the binary unit 14.)

Upon occurrence of the second, third and fourth forward counting pulses, the transistors 50C, 50D and 50E, respectively are cut off, while the transistor 96-1 remains cut off thereby indicating the counts of two, three and four, respectively. When switching from a count of three to a count of four, wherein transistor 50E switches from a conducting to a nonconducting state, the collector potential of transistor 50E (waveform 2 of FIG. 2) slowly rises from about zero to approximately +10 volts, and this +10-volt gate control signal is coupled through lead wire 86 to the cathode electrode of gate control diode 84 to back-bias the same. Now, upon the occurrence of the fifth forward counting pulse the quinary unit returns to the $\bar{1}$ state wherein the transistor 16D is switched to a conducting state whereupon the potential on bus 40D abruptly drops to zero potential as shown at waveform 1 of FIG. 2. With bus 40D grounded, the diodes 72 and 74-1 are forward biased whereupon the voltage at the junction between the capacitor 76-1 and the resistor 92-1 suddenly drops from about +10 volts to 0 volts. The charge on the capacitor 76-1 is unable to change appreciably during the sudden transition because the time constant of the capacitor 76-1 and resistor 68-1 is large in comparison with the transition period of the signal on the bus 40B. Consequently, a 10-volt decrease is effected at the base electrode of the transistor 62-1 to switch it off.

When transistor 62-1 switches off the transistor 62-2 of the bistable multivibrator is turned on. The positive and negative signals from the collector electrodes of transistors 62-1 and 62-2 are coupled to the base electrode of transistors 96-1 and 96-2, respectively, whereupon transistor 96-1 is switched to a conducting condition and transistor 96-2 is cut off. The potential at the $\bar{5}$ binary output terminal 102-1 goes to zero and the 5 binary output terminal 102-2 increases to approximately +10 volts to indicate a 5 condition of the binary unit. With the transistor 50A cut off the quinary unit indicates a $\bar{1}$ condition whereby a total count of 5 is indicated.

During counter states 0 to 4, the transistor 96-2 is conducting for application of a zero potential gate control signal to the diode 108-2. The potential at the junction between the diodes 106-2 and 108-2 therefore cannot rise above zero volts. Consequently, when the potential at the bus 73 drops from approximately +10 volts to 0 volts upon occurrence of the fifth, forward counting pulse, no change in potential is effected at the output terminal 104-2. When the transistor 96-2 switches from a conducting to a nonconducting condition upon occurrence of the fifth forward counting pulse, and the voltage at the collector electrode slowly rises to approximately +10 volts, the diode 106-2 is conditioned to pass the next negative-going forward counting pulse occurring at bus 73.

When transistor 96-1 switches from a nonconducting to a conducting condition in going from count 4 to count 5 the potential at the collector electrode thereof relatively slowly switches from about +10 volts to ground potential because of the relatively large coupling capacitor 110-1 between the base and collector electrodes. The diodes 108-1 and 32' are thereby forward biased whereby the voltage at the junction between the capacitor 34' and resistor 38' slowly reduces to zero. The RC time constant of the capacitor 34' and resistors 42' and 44' is small in comparison with the transition period of the gate control signal from the transistor 96-1. Consequently, the charge on the capacitor 34' changes with the gate control signal from the transistor 96-1, and the voltage at the base electrode of the transistor 16' connected to the capacitor 34' is substantially unaffected by the gate control signal. With the terminal 104-1 at zero potential the diode 106-1 is reverse biased to prevent transfer of reverse counting pulses from the bus 79 to the terminal 104-1.

Upon occurrence of the sixth, seventh, eighth and ninth counting pulses, the transistors 50B, 50C, 50D and 50E, respectively are cut off while the transistor 96-1 remains conducting thereby indicating the counts of six, seven, eight and nine, respectively. When switching from a count of 8 to a count of 9 wherein transistor 50E again switches from a conducting to a nonconducting state, the +10-volt collector potential of the collector electrode of transistor 50E (see waveform 2 of FIG. 2) is again coupled to diode 84 to back-bias the same. Upon occurrence of the tenth forward counting pulse the quinary unit returns to the $\bar{1}$ state wherein the transistor 16D is switched to a conducting state whereupon the potential at bus 40D abruptly drops to zero potential as seen at waveform 1 of FIG. 2. With bus 40D grounded, the diodes 72 and 74-2 are forward biased and transistor 62-2 is cut off whereupon the transistor 62-1 of the bistable multivibrator is turned on. The negative and positive signals from the collector electrodes of transistors 62-1 and 62-2 are coupled to the base electrodes of transistors 96-1 and 96-2, respectively, whereupon transistor 96-1 is switched off and transistor 96-2 is switched to a conducting condition. The potential at the $\bar{5}$ binary output terminal 102-1 rises to about +10 volts to indicate a 5 condition of the binary unit, and the state 5 output terminal 102-2 goes to zero potential. It will also be seen that during states 5 through 9 of the counter, the transistor 96-2 is cut off whereby the collector electrode thereof is at a +10 volt potential (see waveform 3 of FIG. 2). Consequently, when the potential on the bus 40D drops to zero when going from state 9 to state zero, diodes 72 and 106-2 are forward biased (assuming a positive gate control signal is applied to resistor 36' in the counting unit 10') whereupon the potential at terminal 104-2 abruptly drops to zero potential to provide a negative-going forward counting pulse to the next counter stage 10'.

With additional forward counting pulses at line 29, the counter is driven forward in the manner described above.

Reverse counting operation is similar to the forward counting operation. In brief, the quinary unit 10 is driven in a reverse direction with negative going counting pulses applied to the bus 31. The operation of the quinary unit has been described in detail and it is believed that no further description thereof is required. Upon occurrence of the first reverse counting pulse, when switching from count 0 to count 9, transistor 50A is slowly switched from a nonconducting to a conducting condition and transistor 50E is slowly switched from conducting to nonconducting condition. (See FIG. 3, waveforms 5 and 2, respectively.) The positive potential gate control signal from the collector electrode of transistor 50A (waveform 5 of FIG. 3) reverse biases diodes 90, and when bus 40B abruptly drops to zero potential the diodes 78 and 80-1 conduct and transistor 62-1 is cut off to switch the state of the binary multivibrator 14.

Figure 3:
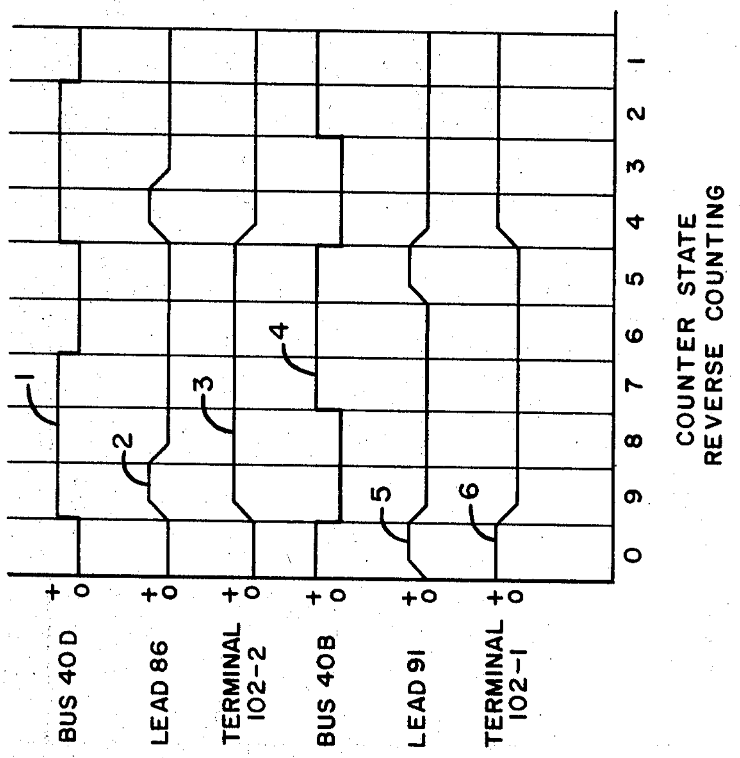
FIG. 3 shows a series of waveforms which occur during reverse counting.
Figure 2:
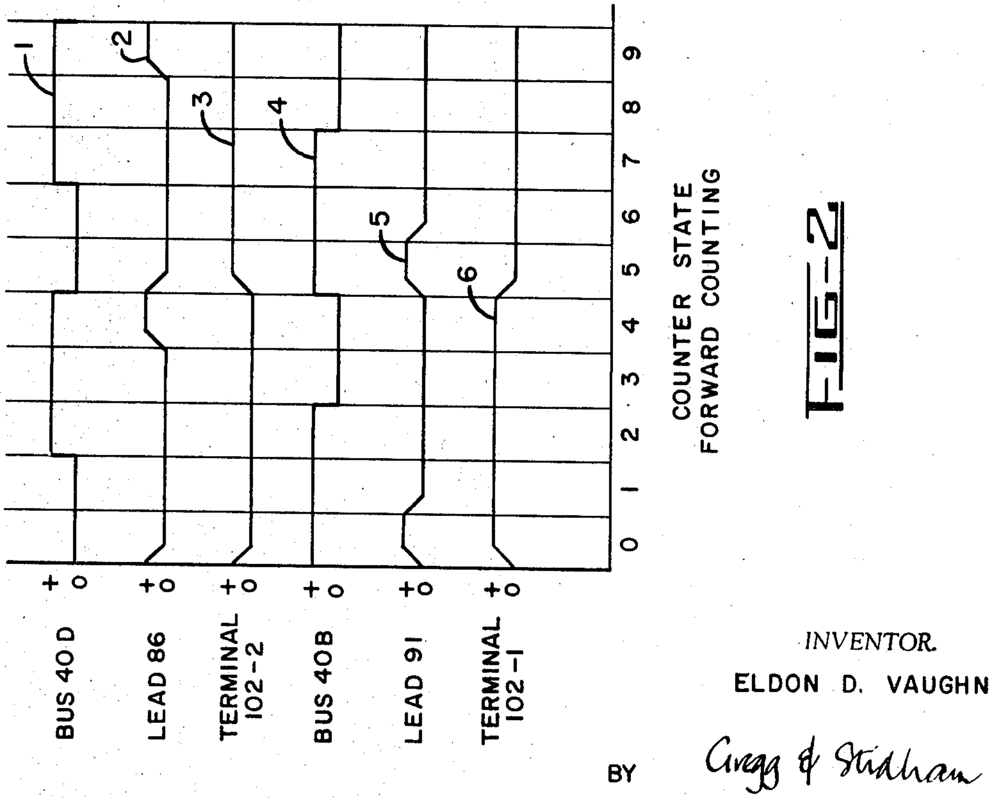

When switching from count 9 to count 8, upon occurrence of a second reverse counting pulse, the transistor 50E is slowly switched from nonconducting to conducting (waveform 2 of FIG. 3) and the transistor 50D switches from conducting to nonconducting. The gate control signal from the collector electrode of transistor 50E forward biases diodes 84 and 74-2 to slowly reduce the potential at the junction between the capacitor 76-2 and resistor 92-2 without changing the positive potential on the base electrode of transistor 62-2. Transistor 62-2 therefore remains conducting. As seen in FIG. 3, during reverse counting negative going pulses at bus 40B (waveform 1) occur when the gate control signal at lead 86 (waveform 2) is at zero potential. Consequently, pulses at bus 40B are prevented from reaching the binary unit 14.

Upon occurrence of the third, fourth, and fifth reverse counting pulses the transistors 50C, 50B and 50A, respectively, are cut off, while the transistor 96-2 remains conducting, thereby indicating counts of seven, six and five, respectively.

When switching from a count of six to a count of five wherein transistor 50A switches from a conducting to a nonconducting state, the +10-volt collector potential of the transistor 50A is coupled through lead wire 91 to the cathode electrode of diode 90 to back-bias the same. (See waveform 5 of FIG. 3.) Now, upon the occurrence of the sixth reverse counting pulse (when going from state five to state four) the quinary unit returns to the state whereupon the potential at bus 40B abruptly drops to zero potential as shown at waveform 4 of FIG. 3. With the bus 40B grounded, the diodes 78 and 80-2 are forward biased whereupon the voltage the the junction between the capacitor 82-2 and resistor 94-2 suddenly drops from about +10 volts to ground potential. The charge on the capacitor 82-2 is unable to change appreciably during the sudden transition period of the signal at bus 40B and, consequently, a 10-volt decrease is effected at the base electrode of the transistor 62-2 to switch it off. The other transistor 62-1 of the bistable multivibrator is then turned on, whereupon the 5 binary output terminal 102-2 goes to zero potential and the $\bar{5}$ binary output terminal 102-2 increases to about +10 volts to indicate a 5 condition of the binary unit. With transistor 50E cut off the quinary unit indicates a "4" condition.

During the count of zero the diode 108-1 is back-biased by application of a positive potential thereto from the collector electrode of transistor 96-1. Upon occurrence of a reverse counting pulse at bus 40B when going from a count of 0 to a count of 9, the diodes 78, 106-1 and 32' are forward biased (assuming a positive gate control signal is applied to the resistor 38' in the unit 10') whereupon the pulse is coupled to the base electrode of the transistor 16'.

Upon occurrence of the seventh, eighth, ninth and tenth reverse counting pulses the transistors 51D, 51C, 51B and 51A, respectively, are cut off while transistor 96-1 remains conducting thereby indicating the counts of four, three, two, one and zero, for completion of the counting cycle and return to the zero condition. The reverse counting cycle is repeated with the application of additional reverse counting pulses.

The invention having been described in detail in accordance with the requirements of the Patent Statutes, various changes and modifications may suggest themselves to those skilled in this art and it is intended that such changes and modifications shall fall within the spirit and scope of the invention as defined in the appended claims.

I claim:

1. A counter for counting applied counting pulses comprising:

- $2n+1$ counting stages where $n$ is a whole number;
- each stage including one controllable switching element having a conductive state of operation and a nonconductive state of operation, each switching element having at least a control electrode and an output electrode;
- resistance elements conductively coupling the output electrodes of the switching elements of two stages to the input electrode of a single switching element of another stage such that two switching elements in the nonconducting states switch another switching element to a conducting state whereby $n$ stages are in a conducting state and $n+1$ stages are in a nonconducting state;
- AC gating means for each stage for gating forward counting pulses to the stages;
- each AC gating means having input, output and gate control signal terminals; and
- means for connecting the AC gate input terminals to a source of forward counting pulses, means connecting the AC gate output terminals to the individual input electrodes of the switching elements, and means for connecting the gate control signal terminals of each gating means to the output electrode of the switching elements in the preceding stage.

2. The counter as defined in claim 1 including second AC gating means for each stage for gating reverse counting pulses to the stages, each of said second AC gating means having input, output and gate control signal terminals, means for connecting the input terminals of the second AC gates to a source of reverse counting pulses, means connecting the output terminal of each of the second AC gates to the individual input electrodes of the switching elements, and means for connecting the gate control terminals for each second gating means to the output electrode of the switching element in the following stage.

3. The counter as defined in claim 1 wherein there are five counting stages comprising:

- a quinary unit;
- a binary unit comprising a bistable multivibrator;
- means for coupling the output electrode of the switching element of one of said quinary stages to the binary unit for triggering the same;
- means including a gating circuit for coupling the output electrode of the switching element of said one quinary stage to a succeeding counter unit; and
- means under control of said binary unit for opening and closing said gating circuit to selectively pass signals from said one quinary stage to a succeeding counter unit.

4. The counter as defined in claim 3 wherein said means including a gating circuit for coupling the output electrode of the switching element of said one quinary stage to a succeeding counter unit also includes said means for coupling the output electrode of the switching element of said one quinary stage to the input of the binary unit.

5. A counting circuit comprising:

- a plurality of counting stages, each comprising a single counting device having input and output electrodes;
- all of said devices being interconnected so that $n$ devices conduct while $n+1$ devices are nonconducting where $n$ is a whole number;
- the input electrode of each device being separately connected through first and second resistive paths to the output electrodes of two counting devices in nonadjacent stages;
- each input electrode being connected through a capacitor and diode to a common input signal bus; and
- the junction between the capacitor and diode at each input electrode being connected through a third resistive path to the output electrode of a counting device in an adjacent stage.

6. The counter as defined in claim 5 wherein each input electrode is connected through a second capacitor and diode to a second common input signal bus, the junction between the second capacitor and diode at each input electrode being connected through a fourth resistive path to the output electrode of a device in an adjacent stage in a direction opposite to the connection of said third resistive path.

7. The counter as defined in claim 5 including:

- a binary stage comprising a pair of counting devices each having input and output electrodes, said pair of counting devices being interconnected so that one is conducting while the other is nonconducting;
- means for connecting the output electrode of a counting device of one of said counting stages to the input electrodes of said pair of counting devices;
- means under control of one of said pair of counting devices for producing a gating signal; and
- a gate having as an input the output from said counting device of said one counting stage and having as a gate control signal the gating signal from said means under control of one of said pair of counting devices.

8. The counter as defined in claim 7 wherein:

- said means for connecting the output electrode of a counting device of one of said counting stages to the input electrode of said pair of counting devices includes a diode gate; and
- means under control of the output from a pair of counting devices in adjacent counting stages for producing a gate control signal for opening and closing said diode gate.